(12) United States Patent
Ellingboe et al.

(10) Patent No.: US 8,890,412 B2
(45) Date of Patent: Nov. 18, 2014

(54) PLASMA SOURCE ELECTRODE

(75) Inventors: Albert Rogers Ellingboe, Dublin (IE); David O'Farrell, Dublin (IE); Tomasz Michna, Dublin (IE)

(73) Assignee: Dublin City University, Dublin (IE)

(*) Notice: Subject to any disclaimer, the term of this patent is extended or adjusted under 35 U.S.C. 154(b) by 378 days.

(21) Appl. No.: 13/144,213

(22) PCT Filed: Jan. 8, 2010

(86) PCT No.: PCT/EP2010/050168
§ 371 (c)(1),
(2), (4) Date: Sep. 15, 2011

(87) PCT Pub. No.: WO2010/079220
PCT Pub. Date: Jul. 15, 2010

(65) Prior Publication Data
US 2012/0001549 A1    Jan. 5, 2012

(30) Foreign Application Priority Data
Jan. 12, 2009  (GB) .................................. 0900411.0

(51) Int. Cl.
*H05H 1/00*    (2006.01)
*H01J 37/32*   (2006.01)

(52) U.S. Cl.
CPC ..... *H01J 37/32568* (2013.01); *H01J 37/32009* (2013.01); *H01J 37/32165* (2013.01); *H01J 37/32091* (2013.01)
USPC ..................................... 315/111.21; 313/326

(58) Field of Classification Search
CPC .............................. H05J 1/00; H01J 37/32009
USPC ..................................... 315/111.21; 313/326
See application file for complete search history.

(56) References Cited

U.S. PATENT DOCUMENTS

| 5,609,690 | A | * | 3/1997 | Watanabe et al. | ......... 118/723 E |
| 5,981,899 | A | * | 11/1999 | Perrin et al. | ............ 219/121.52 |
| 6,403,490 | B1 | * | 6/2002 | Lagarde et al. | ............... 438/710 |
| 2002/0127853 | A1 | * | 9/2002 | Hubacek et al. | .............. 438/689 |
| 2003/0079983 | A1 | * | 5/2003 | Long et al. | ..................... 204/164 |
| 2006/0221540 | A1 | * | 10/2006 | Himori et al. | ................. 361/234 |
| 2006/0254518 | A1 | * | 11/2006 | Ellingboe | ................... 118/723 I |

FOREIGN PATENT DOCUMENTS

| GB | 2 458 953 A | 10/2009 | |
| JP | 2007-107076 A | 4/2007 | |
| WO | 98/32154 | 7/1998 | |
| WO | 01/63642 | 8/2001 | |
| WO | 2008/042128 | 4/2008 | |
| WO | WO2008042128 | * 4/2008 | .............. H01J 37/32 |
| WO | 2008/055993 | 5/2008 | |

OTHER PUBLICATIONS

International Search Report, mailed Apr. 9, 2010, for PCT/EP2010/050168, 5 pages.
Written Opinion, mailed Apr. 9, 2010, for PCT/EP2010/050168, 8 pages.

* cited by examiner

*Primary Examiner* — Alexander H Taningco
*Assistant Examiner* — David Lotter
(74) *Attorney, Agent, or Firm* — Seed IP Law Group PLLC

(57) ABSTRACT

An electrode tile configuration is disclosed. The tile has contoured edges dimensioned to control any coupling effects. A plurality of tiles in a matrix configuration is also described.

8 Claims, 6 Drawing Sheets

PLASMA SOURCE ELECTRODE

CROSS-REFERENCE TO RELATED APPLICATION

This application is a U.S. national stage application filed under 35 U.S.C. §371 of International Patent Application PCT/EP2010/050168, accorded an international filing date of Jan. 8, 2010, which is incorporated herein by reference in its entirety.

FIELD OF THE INVENTION

The present invention relates to plasma sources and in particular to electrodes for use in plasma sources. The invention relates in one aspect to specific electrode geometries that may usefully be employed to efficiently couple power into a plasma volume.

BACKGROUND

Plasma sources are well known. An example is described in WO2008055993 assigned to Dublin City University. In this arrangement a plasma reactive impedance element that is formed from a plurality of unique tiles is described. The tiles are arranged such that immediately neighbouring tiles are coupled out of phase with one another. In this way wavelength effects that are traditionally associated with plasma sources may be minimised.

Within the context of such plasma sources there are however issues encountered regarding specifics of the tile design. For example between immediately neighbouring tiles capacitive coupling may impact deposition profiles under the tiles in that pattern effects may be transferred from the tiles onto the film which is being treated within the plasma chamber. Within the area proximate to tile boundaries there is a possibility of plasma formation which can result in increased deposition in these areas as opposed to the regions immediately below the tile centres—this can obviously affect the consistency of deposition. Furthermore edge coupling effects between tiles are dependent on plasma conditions. While this can be addressed by minimizing the actual dimensions of the individual tiles there is the corresponding result for large plasma areas of requiring too many tiles.

For these and other reasons there is a requirement for an improved electrode for use in plasma sources.

SUMMARY

These and other problems are addressed by an electrode tile in accordance with the teaching of the present invention. In a first arrangement such a plasma source electrode tile comprises a body having upper and lower surfaces separated by side walls, and wherein the side walls along the length of the body define a beveled edge.

Desirably, the upper and lower surfaces are substantially rectangular each having a length and a width, the upper surface being wider than the lower surface such that the side walls along the length of each of the upper and lower surfaces provide a beveled edge.

The beveled edge is desirably orientated such that the side walls flare outwardly from the lower surface prior to joining with the upper surface.

The tile is desirably orientated within the plasma source such that the lower surface is facing the plasma volume.

By providing a beveled edge when two or more electrode tiles are aligned length to length, the distance between the lower surfaces of each of the immediately adjacent tiles is greater than the distance between the upper surfaces of each of the immediately adjacent tiles.

There is also provided within the context of the present teaching a spacer that is dimensioned to be received within a gap defined between two immediately adjacent electrode tiles. The spacer desirably affects the changes in electrode coupling with changes in plasma conditions. The spacer is typically at least partially formed from an insulator that is dimensioned to be received within the gap defined between two aligned neighbouring electrode tiles. By providing an insulator between the bodies of each of the neighbouring electrode tiles and having the electrodes out of phase with one another it is possible to both minimize any resultant wavelength effects and to reduce any increase in plasma power deposition at the boundary between neighbouring electrodes. As a result it is possible to equalise the density of the plasma power deposition across a greater area.

Depending on the relative height of the individual tiles to their separation from one another, the insulator body is desirably dimensioned such that its height it greater than its width. The spacer may additionally include an insulator face plate that is orientated substantially perpendicular to the insulator body. The insulator face plate will desirably be located relative to each of the neighbouring electrode tiles such that it overlaps at least partially with lower surfaces of each of the neighbouring tiles. The insulator face plate provides control in capacitive coupling between the individual tiles and the plasma and also between the tile to tile boundaries. By varying the length and/or thickness of the insulator face plate and the material used to fabricate the plate it is possible to vary the level of coupling achieved. The insulator face plate is desirably coupled to an end surface of the insulator body, the insulator bisecting the insulator face plate such that equal lengths of the insulator face plate overlap with each of the adjacent electrode tiles.

The spacer may desirably also include first and second coupling rings provided on first and second sides of the insulator with each of the coupling rings being in intimate contact with each of the insulator and the insulator face plate. The coupling rings desirably comprise a beveled edge opposite in orientation to the beveled edges of the electrode tiles such that on presentation of the spacer to the gap between the adjacent electrode tiles, the respective beveled edges of each of the coupling rings and the electrode tiles will overlap. By providing such a coupling ring it is possible to control coupling between adjacent electrode tiles that are out of phase with each other.

The electrode tile desirably is dimensioned such that its lower surface (i.e. that surface that is operably proximal to the generated plasma) is longer than the upper surface (i.e. that surface that is operably distally located to the generated plasma) such that a step is defined at each end of the tile between the upper and lower surfaces of the tile. By defining a step at the end of each tile by removal of some of the body material of the tile in that end region it is possible to reduce coupling effects between tiles that are arranged end to end. Desirably the step is provided such that when tiles are presented end to end, the gap between the lower surfaces of each of the immediately neighbouring tiles is less than the gap between their upper surfaces.

Each of the upper and lower surfaces are desirably orientated relative to one another so as to share a common axis of rotation.

In another arrangement there is provided a plasma source electrode tile comprising a body having first and second opposing end sections, wherein the cross sectional area of at least one of the opposing end sections is less than the cross sectional area of the body.

Desirably each of the end sections have a cross sectional area less than the cross sectional area of the body.

Desirably a flange or step is defined within the body at the end section of the tile, the fabrication of the flange or step being effected by removal of a portion of the body material at the end section of the body.

By reducing the surface area at the end sections of the tile it is possible to minimize any current transfer between neighbouring tiles when aligned end to end.

There is also provided an electrode configuration for mounting a plurality of electrode tiles relative to a plasma generating volume. In such a configuration the electrode tiles are provided in a matrix construction comprising a plurality of rows and columns, each of the rows and columns having a plurality of electrode tiles. In such a matrix construction each of the plurality of electrode tiles are individually powered.

In such a matrix construction rows of tiles may be generated by aligning individual tiles end to end with other tiles. Columns of tiles may be generated by aligning individual tiles length to length with other tiles. The rows and columns of tiles collectively define a washerboard pattern with tiles within each of the rows being provided at the same polarity but adjacent rows being out of phase with each other. By providing the matrix with this electrical configuration it is possible to minimise corner issues that have previously affected plasma source electrode designs.

In a further arrangement an electrode tile is provided that is coupled at first and second ends to first and second RF power supplies. By providing first and second couplings, two power supplies of different phases may be coupled to each end of the tile. The RF power supplies desirably consist of a single RF power supply with a power splitter or, preferably, two RF power supplies with a common and controllable phase reference may be used. The RF power supply/supplies desirably incorporates or is coupled to an impedance matching network designed to improve the power transfer from the power supply to the tiles and resultant plasma.

These and other features will be apparent from the following exemplary arrangements which are provided to assist in an understanding of the teaching of the invention.

BRIEF DESCRIPTION OF THE DRAWINGS

The present invention will now be described with reference to the accompanying drawings in which.

DETAILED DESCRIPTION OF THE DRAWINGS

The teaching of the invention will now be described with reference to exemplary arrangements thereof which are provided to assist in an understanding of the teaching of the invention but which are not in any way intended to limit the scope of the invention to that described.

The present inventors have realised that in evaluating the performance of electrode tiles and their use within plasma sources that non uniform tile-voltage effects occur at ¼ wavelengths of the source RF. A tile will typically have an upper and a lower surface, the lower surface being operably provided proximal to the plasma, and the upper surface distally located to that plasma. As a result of plasma coupling between this lower surface of the tile and the plasma, the distance at which wavelength effects occurs is reduced even further. This reduction is derived from the fact that the plasma acts as a dielectric, reducing the EM propagation velocity. In evaluating these effects it has been noted that the RF path length to the furthest point from the RF feed on the electrode is longer for a square electrode than for a rectangular electrode. This can be understood from the fact that when computing an RF path length for square and rectangular electrodes that the shortest distance a propagating wave must travel to reach the furthest point from the RF source is 2× the radius of the radial distance from centre to edge of electrode, with one full radius of distance with the dielectric loading of the plasma. With longer thinner electrodes this path length is significantly shortened due to the fact that the RF wave will only have to travel to the end of the rectangular electrode and the length of dielectric loading by the plasma is limited to ½ a tile width.

Figure 1:
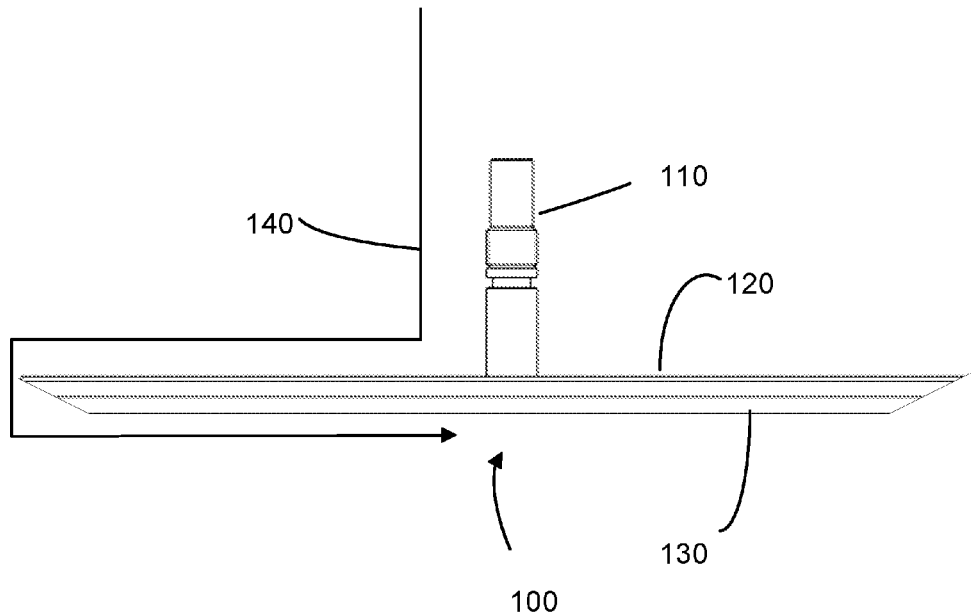
FIG. 1 is shows an RF path along a square electrode.
Figure 2:
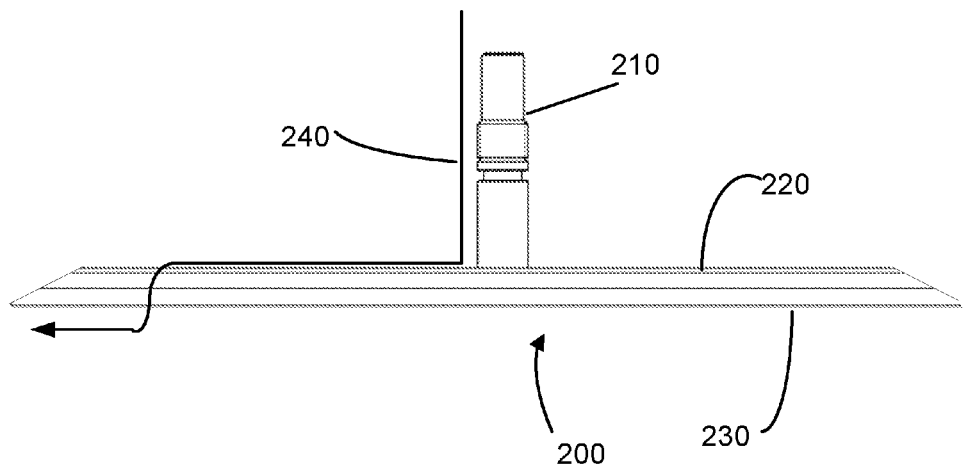
FIG. 2 shows an RF path along a rectangular electrode.

FIGS. 1 and 2 show examples of square 100 and rectangular 200 electrode tiles. For each of the tiles an RF feed 110, 210 is coupled to an upper surface 120, 220 of the tile. The tile is desirably operably orientated such that a lower surface 130, 230 is provide proximal to a plasma volume whereas the upper surface 120, 220 is remote from the plasma volume. In this way the upper surface is not affected by any dielectric influences generated by the plasma.

An RF feed path 140, 240 for each of the square and rectangular tiles is superimposed into the Figures. It can understood from an inspection of FIGS. 1 and 2 that for the rectangular tile 200 that the RF signal is longer on the upper surface than for the equivalent RF signal in the square tile 100. In each case, the RF travels along the top surface to the extremities or sides of the tiles where it then wraps around the electrode. In a rectangular configuration such as FIG. 2, it is out of contact with the plasma and as such is within an environment where the dielectric constant can be controlled and maintained low to ensure fast propagation—thus reducing the path length that is loaded or affected by the plasma.

Figure 3:
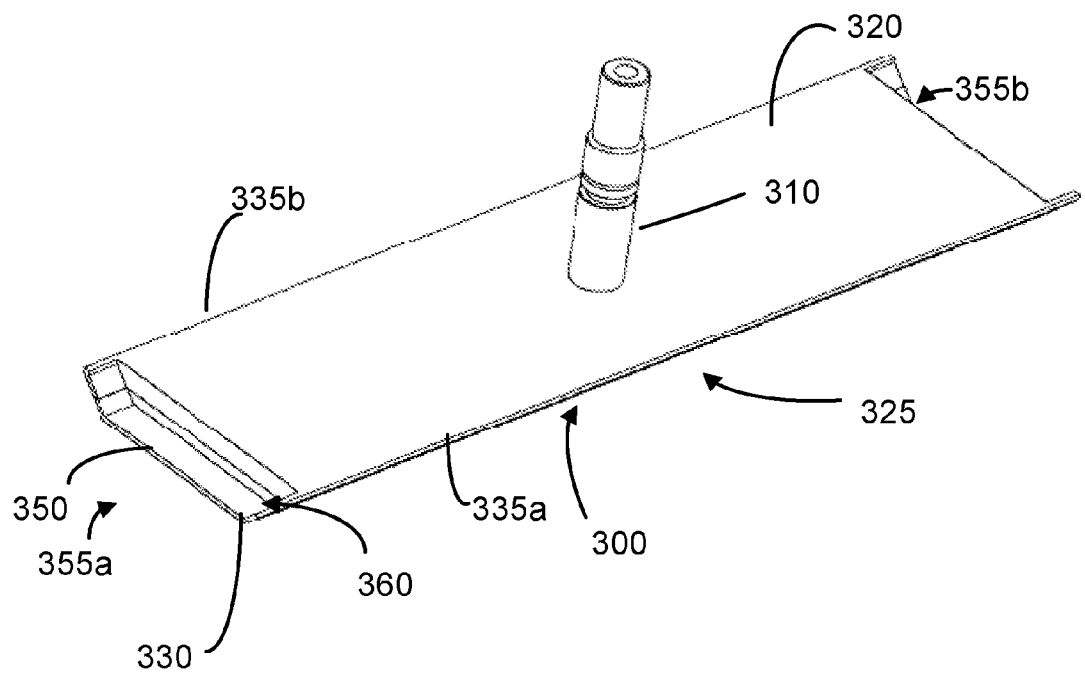
FIG. 3 is a top perspective view of an elongated electrode or electrode tile provided in accordance with the present teaching.
Figure 4:
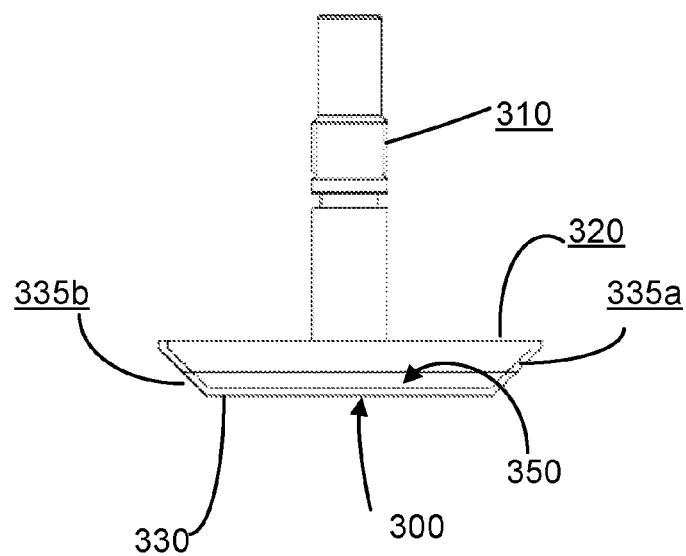
FIG. 4 is an end view of the electrode of FIG. 3.

Using this understanding, and also based on the realisation that many of the wavelength effects may be related to edge effects on the electrode tile, it is possible within the context of the present teaching to provide an improved electrode tile geometry that addresses these and other problems. FIGS. 3 and 4 show an example of such an electrode tile geometry. Similar reference numerals will be used for similar components to that described before.

As shown in FIGS. 3 and 4 an electrode tile 300 includes an RF feed 310 that is coupled to an upper surface 320 of the body 325 of the tile. This single RF feed is desirably coupled, via a single coupling to the tile. The tile is dimensioned to define an elongated electrode having a length greater than its width. The upper surface 320 is separated from the lower surface 330 by side walls 335*a*, 335*b*. To reduce any coupling or boundary effects at the plasma face the surfaces of the side walls are contoured and desirably are contoured to define a beveled edge that extends along each length of the tile.

As is evident from an inspection of FIGS. 3 and 4, desirably, the upper 320 and lower 330 surfaces are substantially rectangular each having a length and a width, the upper surface being wider than the lower surface such that the side walls along the length of each of the upper and lower surfaces provide a beveled edge that flares upwardly and outwardly from the lower surface to the upper surface. While FIG. 4 shows the contour as being a complete bevel, i.e. the slope of the edge extends completely from the bottom to the top, other arrangements may employ an incomplete bevel or chamfered edge between the upper and lower surfaces.

Figure 5:
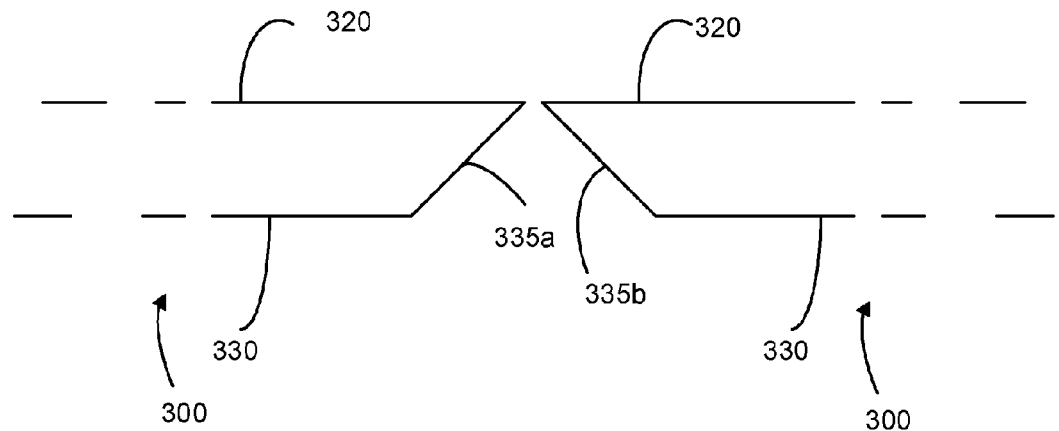
FIG. 5 is a schematic showing two electrodes arranged side by side along their lengths.

By providing a beveled edge, it will be appreciated that when two or more electrode tiles are arranged relative to one another such that they are aligned length to length, such as shown schematically in FIG. 5, the distance between the lower surfaces 330 of each of the immediately adjacent tiles 300 may be greater than the distance between the upper surfaces 320 of each of the immediately adjacent tiles.

To ensure that any gaps between adjacent electrodes does not generate any unwanted effects within the plasma which can affect the deposition quality of the process conducted, an configuration in accordance with the present teaching provides a spacer that is dimensioned to be received within a gap defined between two immediately adjacent electrode tiles. The spacer desirably affects the coupling between the two electrodes.

Figure 6:
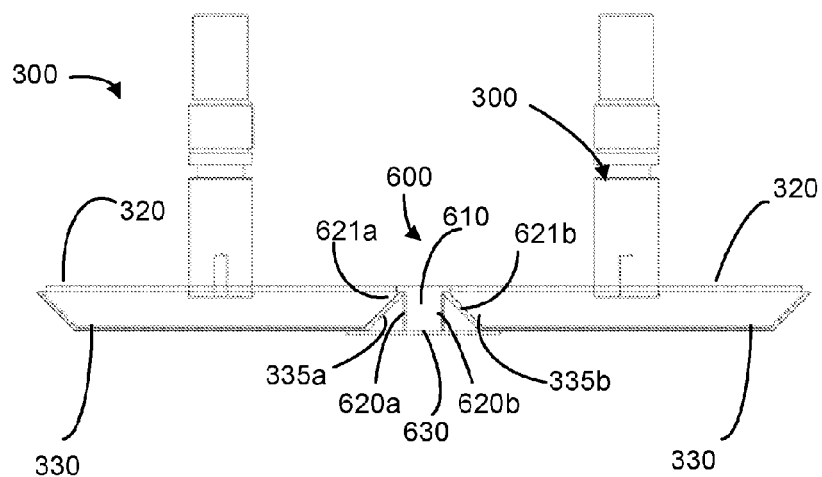
FIG. 6 shows a similar arrangement to FIG. 5 but with a spacer provided between the two electrodes.

FIG. 6 is an example of such a spacer 600. The spacer in this arrangement includes three components: an insulator body 610 which is provided to reduce current flow between electrodes and thereby control A effects; a coupling ring 620 which can be fabricated in various shapes and materials to control coupling at the corners of the electrodes; and an insulator face plate 630 which operably can be provided in various lengths and materials so as to optimise the degree of capacitive coupling to the plasma and the electrode tile to tile boundary.

As is evident from FIG. 6, the spacer insulator 610 is dimensioned to be received within the gap defined between two aligned neighbouring electrode tiles. By providing an insulator 610 between the bodies of each of the neighbouring electrode tiles an electrical break is formed allowing neighboring tiles to be driven by electrical signals at opposite polarities. By driving adjacent electrodes in opposite polarities, wavelength effects in this dimension are minimized. By using an insulator in the gap between the bodies of the neighbouring tiles an electrical break is provided such that the electrodes can be driven at opposite polarities, and the potential of a plasma being formed in that gap is minimised.

The insulator is desirably dimensioned such that its height it greater than its width. The spacer may additionally include an insulator face plate 630 that is orientated substantially perpendicular to the insulator 610. The insulator face plate will desirably be located relative to each of the neighbouring electrode tiles such that it overlaps at least partially with lower surfaces 330 of each of the neighbouring tiles. The insulator face plate provides control in capacitive coupling between the individual tiles and the plasma and also between the tile to tile boundaries. By varying the length, thickness, and the material used to fabricate the insulator face plate it is possible to vary the level of coupling achieved. The insulator face plate 630 is desirably coupled to an end surface of the insulator 610, the insulator bisecting the insulator face plate such that equal lengths of the insulator face plate overlap with each of the adjacent electrode tiles.

The spacer may desirably also include first 620a and second 620b coupling rings provided on first and second sides of the insulator each being in intimate contact with each of the insulator and the insulator face plate. The coupling rings desirably comprise a beveled edge 621a, 621b opposite in orientation to the beveled edges of the electrode tiles such that on presentation of the spacer to the gap between the adjacent electrode tiles, the respective beveled edges of each of the coupling rings and the electrode tiles will overlap. By providing such a coupling ring it is possible to control coupling along the lengths of the electrode tiles.

Returning to FIGS. 3 and 4, the electrode tile 300 desirably is dimensioned such that its lower surface 330 is longer than the upper surface 320 such that a step 350 is defined at each end 355a, 355b of the tile between the upper and lower surfaces of the tile. By removal of some of the body material of the tile in that end region, so as to define a step or flange at the end of each tile, it is possible to reduce coupling effects between tiles that are arranged end to end. A cut away region 360 between the upper and lower surfaces is defined by this step, which serves to shorten the upper surface such that it does not extend to be flush with the end of the lower surface. In this arrangement it will be appreciated that the body of each tile has first and second opposing end sections, wherein the cross sectional area of at least one of the opposing end sections is less than the cross sectional area of the body.

Figure 7:
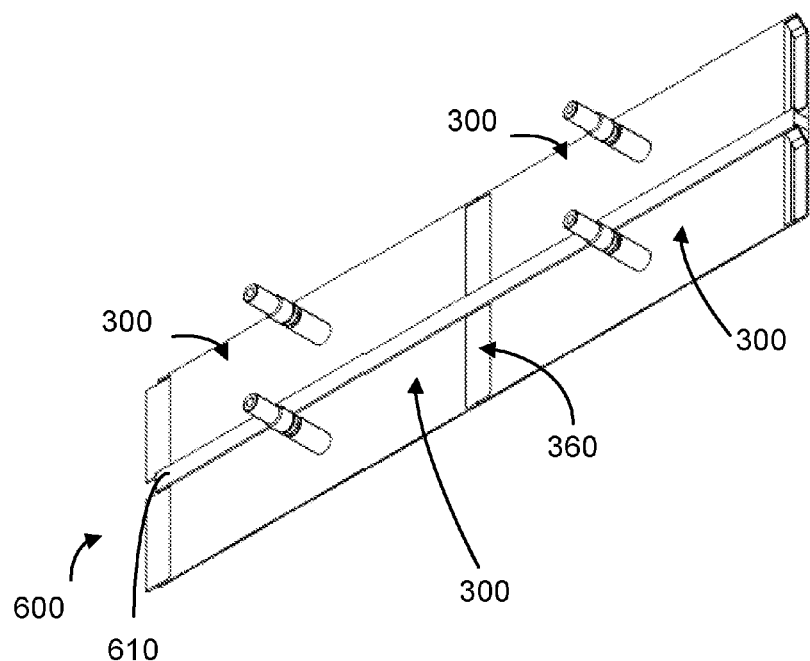
FIG. 7 shows a 2×2 array of electrode tiles.

As shown in FIG. 7, the step is provided such that when presented end to end, the cut away region 360 defines a gap between the ends of the upper surfaces of immediately adjacent tiles. The distance between the lower surfaces of each of the immediately neighbouring tiles 300 is less than the gap between their upper surfaces. FIG. 7 also shows how in such an arrangement that immediately adjacent tiles that are arranged length to length, are separated from one another by a spacer 600, the insulator element 610 of the spacer extending up through the gap between the two electrode tiles and providing a contiguous element between the two tiles.

Such an arrangement of FIG. 7 can be considered a simplified 2×2 matrix with two rows of tiles and two columns of tiles. Such a matrix can be extended in dimension to an N×N matrix or an N×M matrix where N and M are different integers.

Such a matrix configuration provides an electrode configuration for mounting a plurality of electrode tiles relative to a plasma generating volume. In such a configuration the electrode tiles are provided in a matrix construction comprising a plurality of rows and columns, each of the rows and columns having a plurality of electrode tiles. In such a matrix construction each of the plurality of electrode tiles may be individually powered.

Figure 8:
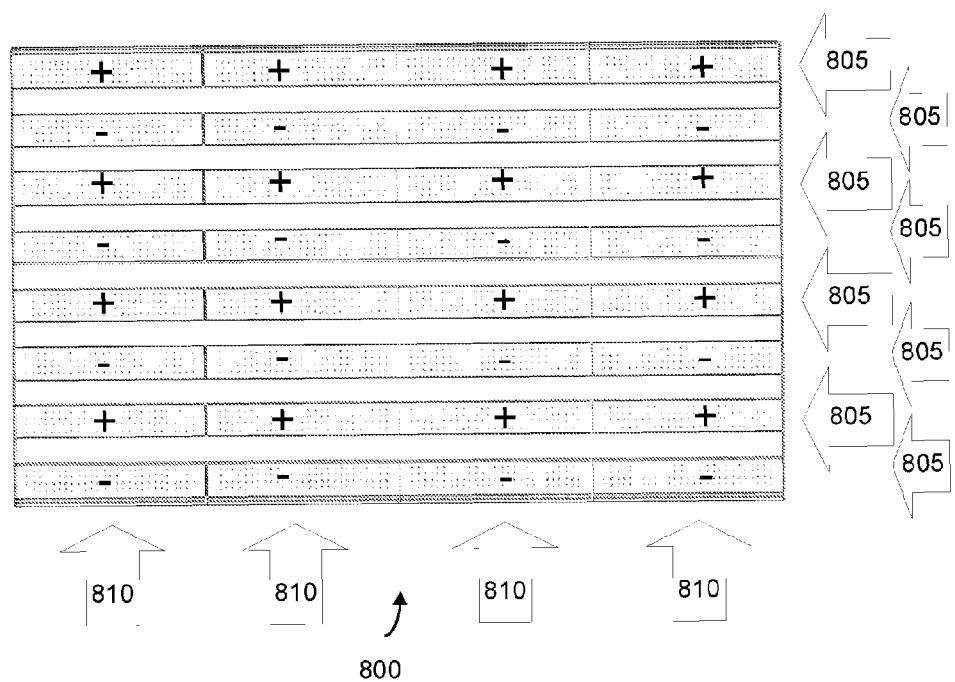
FIG. 8 shows an electrical configuration for an electrode matrix in accordance with the present teaching.

In such a matrix construction rows of tiles may be generated by aligning individual tiles end to end with other tiles. Columns of tiles may be generated by aligning individual tiles length to length with other tiles. The rows and columns of tiles collectively define a washerboard pattern 800 such as that shown in FIG. 8 with tiles within each of the rows 805 being provided at the same polarity, as indicated by the + sign, but adjacent rows being out of phase with each other, as indicated by the − sign. In this way the immediately adjacent tiles of each column 810 will be out of phase with one another. By providing the matrix with this electrical configuration it is possible to minimise corner issues that have previously affected plasma source electrode designs.

Figure 9:
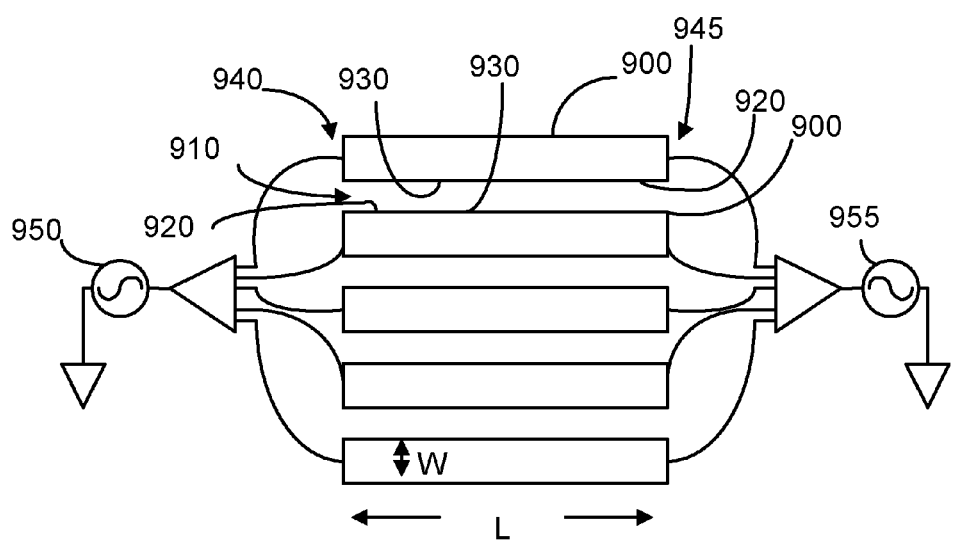
FIG. 9 shows an alternative electrode configuration whereby first and second ends of individual electrodes are coupled to power supplies that are out of phase with one another.

In another tile arrangement shown in FIG. 9, a plurality of electrode tiles 900 are provided. While the arrangement shows five individual tiles, it will be appreciated that only at least two are required. Similarly to that that described before each of the tiles comprise a body having upper and lower surfaces separated by side walls, the lower surfaces being operably proximal to the plasma volume. When the two electrode tiles are arranged side by side they are separated from one another by a gap 910. In such an arrangement, the side wall 920 of each of the first electrode tiles bordering the gap 910 defines a beveled edge 930—in a fashion similar to that described in FIG. 3. However in this arrangement instead of having a single RF power feed provided to each electrode tile, this configuration comprises first 940 and second 945 electrical connections provided at opposite ends of the tiles.

Such a tile configuration is configured for use with a plasma source comprising a first 950 and second 955 RF power supply for coupling to each of the first 940 and second 955 electrical connections respectively. The first and second power supplies operably provide RF power of different phases to each of the two ends of the tiles. The RF power supplies desirably consist of a single RF power supply with a power splitter or, preferably, two RF power supplies with a common and controllable phase reference. The RF power supply/supplies desirably incorporates an impedance matching network designed to improve the power transfer from the power supply to the tiles and resultant plasma. This impedance matching network may be considered a matchbox as will be appreciated by those skilled in the art.

By providing the tiles in an arrangement whereby the beveled edges of each tile face each other, coupling between tiles is minimised. The RF power supplies are applied simultaneously resulting in a partially standing wave between a first signal source and a second signal source which are applied to each of the two ends simultaneously, differing desirably only in the phase of the signal applied. This results in a partially-standing-wave voltage distribution along the long-side of the tile, i.e along the length of the longitudinal axis between each of the two connections 940, 945. Desirably phase difference of the power coupled to each of the two ends is known and is typically of the order of 180 degrees. By providing such a voltage distribution with a slow-time-varying phase shift—a first signal oscillating with a sine oscillation versus time and the second with a minus-sine oscillation versus time—it is possible to move the partially-standing-wave voltage distribution up and down along the length of the tile. When examined over a long time period, the resultant effect is a uniform voltage averaged over the tile when averaged over the slow time-period. The slow-varying shase-shift may be realized by including phase-shifters in the electrical line with the standing wave component, such as the lines between the power splitter and the tile ends. In a preferred embodiment, the phase shifters are located between the matchbox and the power splitter. In a preferred embodiment, the phase shifter provided at a first end is a variable inductor with inductance varying as $\sin^2(w_2 t)$ and the phase shifter provided at the second end is a variable inductor with inductance varying as $\cos^2(w_2 t)$) such that the total inductance between the two match boxes is constant over the period of oscillation at $w_2$.

It will be appreciated that the provision of first and second signals oscillating with a sine and cosine dependency ensures that as the series inductance scales as sine^2 and cosine^2, and therefore the sum of the two signal is 1, that there is no change in net inductance.

It will be appreciated that the length L of the individual tiles is desirably long with respect the wavelength. Typical values and operating parameters will be such that $L > \lambda/10$. The width W of the individual tiles is desirably less than $\lambda/10$. By providing the tile edges as beveled edges, it is possible to minimise the current flow in a direction perpendicular to the longitudinal axis—i.e. along the length L of the tiles.

The individual power couplings to each end of the individual tiles are desirably routed through a power splitter and coupled to the same power supply. In an exemplary arrangement the power splitter may be such as that described in British Patent Application No. 0806146.7. The size of the oscillation in inductance can be varied and of course other ways of coupling power to the individual tiles could be used. Ideally it is desirable for the phase of the power P1 coupled to a first end of a tile to change with respect to time so that the corresponding voltage V1 (at the electrode tile edge) advances through some portion of a wavelength in the standing wave. In a corresponding fashion the phase of the power P2 coupled to the second end of the same tile should change with respect to time such that V2 at the electrode edge advances through some portion of a wavelength in generated standing wave. Ideally each of the two phases will change at the same rate, ideally maintaining the same difference in phase between the two. In an exemplary fashion, this difference will be such that P2−P1=180° which will remain constant in time, even for the absolute phase of P1 and P2 to be advancing in time.

If this phase difference is maintained so as to have their absolute phase delays advancing in time, then the standing wave/travelling wave voltage distribution along the individual electrode tiles will have nodes and anti-nodes that also advance in time. By having these of the form of sine and cosine, it will be appreciated that a node resultant from the first end will overlap with an anti-node from the second end, thereby effectively cancelling out.

It will be appreciated that the specifics of the geometry of a tile having first and second power couplings each being out of phase with one another has not been described. In common with that described with reference to FIGS. 1 to 8 such tiles could be provided with beveled edges and cut-out end portions. In such arrangements, the beveled edge formed by the side edges and the cut-out at the end of each tile serve to minimize the electrostatic coupling between electrodes aligned end-to-end while simultaneously minimizing the physical separation between edges of adjacent tiles. In this way, the current which couples between two adjacent tiles aligned end-to-end powered at the same phase do not exhibit wavelength effects based on their combined length, but only due to the length of individual tiles. Electrode ends without beveling would have increased coupling between electrode ends, and would have greater wavelength effects; increasing the spacing between end-to-end electrodes would reduce wavelength effects, but cause increased non-uniformity in the plasma due to increased gap between end-to-end electrodes which reduces both the capacitive power coupling from the face of the tiles into the plasma, and power coupling between adjacent long-sides of the tiles in the region of the end-to-end gaps.

While the arrangements heretofore have been described with reference to electrode tiles having a number of specific geometrical configurations, each addressing a specific problem, it will be appreciated that a tile could incorporate one or more features without departing from the spirit or scope of the present invention. Therefore where a specific arrangement or integer is described with reference to any one Figure it will be understood that that arrangement or integer could be interchanged with or replaced with other arrangements or integers without departing from the spirit or scope of the present teaching.

It will be understood that what has been described herein are exemplary arrangements of electrode tiles and configurations for arranging a plurality of electrode tiles within a plasma source and that modifications to that described can be made without departing from the teaching of the present disclosure. Such arrangements provide many advantages over prior arrangements including one or more of the following as appropriate:

Maximise electrode size while limiting wavelength effects

Washboard polarity eliminates corner issues

Electrode shaping reduces effective gap between electrodes, creates virtual single electrodes of similar polarity while minimising wavelength effects Contouring of electrodes to control edge charging and capacitive coupling between electrode through the plasma Capacitive coupling between opposite polarity electrodes controlled though spacer insulator material, coupling ring and faceplate It will be understood that provision of a contoured edge at the end of an elongated electrode reduces current transfer to adjacent electrode of similar polarity, thus reducing wavelength effects. The provision of a contoured edge along the lengths of an elongated electrode controls coupling at the plasma face. These shaped electrodes or electrode tiles:

1) decrease capacitance to reduce current leakage to adjacent electrode

2) Reduce the gap to create virtual continuous electrode facing the substrate which will be typically located below the plasma which is in intimate contact with the lower surfaces of the electrodes.

By using elongated electrodes that are aligned end to end it is possible to reduce the number of electrodes required within a plasma volume for specific deposition areas. The narrow width of each of these elongated electrode tiles minimises the RF path length with plasma loading.

The electrode tiles heretofore described can be usefully employed to enable:

increasing the size of the electrodes without encountering wavelength effects

Creating a virtual continuous electrode with multiple electrodes

Configure the electrode polarity in a washboard design

Contouring electrodes to control power coupling on tile-tile coupling boundary, and build-in hardware design that provides feedback to reduce coupling as the power level goes up Shaping of electrodes to reduce current transfer between electrodes with similar polarity, minimise distance between electrodes to make continuous virtual electrode Shape tiles boundaries along 'virtual-single-electrode' direction to give maximum (capacitive) impedance between tiles thus minimizing current flow along the long-virtual-tiles' direction, thus reducing wavelength effects.]

The words comprises/comprising when used in this specification are to specify the presence of stated features, integers, steps or components but does not preclude the presence or addition of one or more other features, integers, steps, components or groups thereof. Similarly the word outer, inner, upper, lower, top and bottom are provided to infer relative geometries but are not to be construed as limiting the teaching the present invention to such specific orientations.

The invention claimed is:

1. A plasma source electrode tile for use in a plasma source, the tile comprising a body having an upper surface and a single planar lower surface separated by non-parallel side walls, the single planar lower surface being operably provided proximal to and in contact with a plasma volume, and wherein at least one side wall defines a beveled edge, the tile further comprising a first electrical connection and a second electrical connection provided at opposing ends of the tile, the first and the second electrical connections being operably coupled to a first and a second power supplies which are configured to couple RF power of two different phases to each of the first and the second ends of the tile.

2. The tile of claim 1 wherein the upper and lower surfaces are substantially rectangular in shape each having a length along a longitudinal axis and a width transverse to the longitudinal axis, wherein the width of the upper surface is wider than the width of the lower surface.

3. The tile of claim 1 wherein the beveled edge is orientated such that the at least one side wall flares outwardly from the lower surface prior to joining with the upper surface.

4. The tile of claim 1 wherein operably the lower surface is orientated to be facing a plasma volume within the plasma source.

5. A plasma source comprising at least two electrode tiles provided at a first side of a plasma volume, the at least two electrode tiles each comprising a body having an upper surface and a single planar lower surface separated by at least one side wall, each of the single planar lower surfaces being proximal to a plasma volume and wherein the two electrode tiles are arranged side by side and are separated from one another by a gap, a portion of the side wall of each of the first electrode tiles bordering the gap having a beveled edge, and wherein each of the electrode tiles comprise a first electrical connection and a second electrical connection provided at opposite ends of the respective tiles, the plasma source comprising a first RF power supply and a second RF power supply to couple to each of the first and the second electrical connections respectively, the first and the second power supplies operably providing RF power of different phases to each of the two ends of the tiles.

6. The source of claim 5 wherein the first and the second RF power supplies are configured for providing simultaneous power to each of the two ends.

7. The source of claim 6 wherein the first and the second power supplies are configured such that operably the provision of a power signal first and a second power signal of different phases effects generation of a cyclical voltage distribution along a longitudinal axis of each tile.

8. The source of claim 6 wherein the first power supply is configured to provide a first signal oscillating in phase with a sine dependency and the second power supply is configured to provide a second signal oscillating in phase with a cosine dependency, such that a voltage distribution on the tile over time is effectively uniform.

* * * * *